United States Patent [19]
Fearon et al.

[11] Patent Number: 5,290,718
[45] Date of Patent: Mar. 1, 1994

[54] SIMPLIFIED HIGH RELIABILITY GATE OXIDE PROCESS

[75] Inventors: Paul A. Fearon, Gorham; Todd P. Thibeault, Westbrook, both of Me.

[73] Assignee: National Semiconductor Corporation, Santa Clara, Calif.

[21] Appl. No.: 905,772

[22] Filed: Jun. 29, 1992

[51] Int. Cl.$^5$ .............................................. H01L 21/265
[52] U.S. Cl. ......................................... 437/34; 437/28; 437/57; 437/59; 148/DIG. 9; 148/DIG. 82
[58] Field of Search ............... 437/28, 34, 59, 56, 437/57; 148/DIG. 9, DIG. 82

[56] References Cited

U.S. PATENT DOCUMENTS

| | | | |
|---|---|---|---|
| 4,574,467 | 3/1986 | Halfacre et al. | 437/28 |
| 4,745,083 | 5/1988 | Huie | 437/45 |
| 5,045,492 | 9/1991 | Huie et al. | 437/31 |

FOREIGN PATENT DOCUMENTS

0252450 1/1988 European Pat. Off. .

*Primary Examiner*—Brian E. Hearn
*Assistant Examiner*—Tuan Nguyen
*Attorney, Agent, or Firm*—Daniel H. Kane; Richard C. Calderwood; Stephen R. Robinson

[57] ABSTRACT

A new IC wafer fabrication process provides an improved CMOS active strip mask, etch, $V_T$ adjust, and gate oxide grow sequence particularly applicable for preparation of CMOS transistors in BICMOS wafers. The new gate oxide process reduces the number of process steps and thermal cycles, increases the reliability of the gate oxide layer, and substantially reduces differential stress and thermal stress related structural silicon defects in the epitaxial silicon. The process proceeds by forming a photoresist CMOS active strip mask exposing CMOS transistor active areas, etching and removing the CVD nitride layer over the CMOS transistor active areas, and leaving the EPIOX layer. Further steps include introducing dopant material through the EPIOX layer into the EPI layer of CMOS transistor active areas with the photoresist active strip mask in place and adjusting the threshold voltage $V_T$ of the CMOS transistors. The invention proceeds by stripping the EPIOX layer over the CMOS transistor active areas without growing a sacrificial oxide SACOX layer, and then removing the photoresist CMOS active strip mask. This step is followed by growing a gate oxide layer over the CMOS transistor active areas using a wet oxide grow process at relatively lower temperature than a dry oxide grow process. Other steps of the invention include forming the combined thicknesses of the CVDSIN and EPIOX layers to provide the control screen necessary for controlling the subsequent base implant to maintain the desired $\beta$ specification for bipolar transistors. The layers are formed in a thickness ratio CVDSIN/EPIOX in the range of approximately 5/3 or smaller to achieve the desired reduction in silicon defects and increase in current leakage test yield.

21 Claims, 4 Drawing Sheets

SIMPLIFIED HIGH RELIABILITY GATE OXIDE PROCESS

TECHNICAL FIELD

This invention relates to a new gate oxide process for use in the preparation of CMOS transistors on BICMOS wafers. The invention reduces the number of process steps and thermal cycles in the so-called active strip mask, etch, voltage threshold ($V_T$) adjust, and gate oxide grow sequence. A new wet oxide process is used to grow gate oxide at relatively lower temperature with rapid thermal cycle annealing at high temperature. The invention increases the reliability of the gate oxide layer and substantially reduces differential stress and thermal stress related structural silicon defects in the epitaxial silicon adjacent to nitride and oxide interfaces. It is particularly useful in BICMOS processes to protect bipolar structures from differential stress and thermal stress induced occurrence and propagation of epitaxial silicon crystal lattice defects.

BACKGROUND ART

A BICMOS IC fabrication process for fabricating both bipolar and CMOS transistor structures recently in use at National Semiconductor Corporation, South Portland, Me. 04106 is summarized in TABLE I showing the overall BICMOS mask sequence. Further description of the BICMOS process mask sequences is also found in the Murray J. Robinson, Christopher C. Joyce, and Timwah Luk U.S. patent application Ser. No. 655,676 filed Feb. 14, 1991 for BIPOLAR TRANSISTOR STRUCTURE AND BICMOS IC FABRICATION PROCESS, the Robinson, Joyce, and Luk U.S. patent application Ser. No. 803,214 filed Dec. 6, 1991 for SCHOTTKY DIODE STRUCTURE AND FABRICATION PROCESS, and the Donald J. Desbiens U.S. patent application Ser. No. 840,390 filed Feb. 24, 1992 for WAFER LEVEL RELIABILITY CONTACT TEST STRUCTURE.

TABLE I

| BICMOS WAFER FABRICATION MASK SEQUENCES | |
|---|---|
| Mask No. | Mask Function |
| 1.0 | Buried Collector Layer (BCL) Mask |
| 2.0 | Retro NWELL Mask and Retro SEC Mask |
| 3.0 | Retro PWELL Mask and Channel Stop (CHST) Mask |
| 4.0 | Isolation Oxide (ISOX) Mask |
| 5.0 | Sink Definition Mask & ISOX Gettering Mask |
| 6.0 | CMOS Active Area Definition Mask (Field Oxide Mask) & Collector Base Surface Spacer (CBSS) Definition Mask |
| 7.0 | Active Strip Mask |
| 8.0 | Poly Gate Definition Mask |
| 9.0 | Base Definition Mask |
| 10.0 | Nitride Etch Mask and Collector Base & Emitter Contact Definition Mask |
| 11.0 | Emitter Definition Mask & Collector Sink Contact Mask (Self-Aligned Transistor Mask) |
| 12.0 | N+S/D Source/Drain Mask (NMOS) |
| 13.0 | P+S/D Source/Drain Mask (PMOS) |
| 14.0 | CMOS Contact Definition Mask |
| 15.0 | METAL 1 (M1) Definition Mask |
| 16.0 | VIA Mask (Inter Layer Dielectric Mask) |
| 17.0 | METAL 2 (M2) Definition Mask |
| 18.0 | Passivation Mask and Bond Pad Definition Mask |

A buried collector layer BCL for bipolar transistors is formed typically in a P type substrate using the 1.0 BCL mask, etch, and N+ type dopant material introduction sequence at the beginning of the BICMOS wafer fabrication process. Relatively slow diffusing N type antimony atoms are implanted in the P type substrate to an N+ concentration through an initial oxide layer. A new photoresist layer is then deposited to form the 2.0 retro NWELL mask. The 2.0 retro NWELL mask sequence provides the retro NWELL definition mask, etch, and N+ type impurity ion introduction sequence through an NWELL opening for the CMOS/PMOS transistor structures. At the same time, it also provides a subemitter collector (SEC) region definition mask, etch, and N+ type impurity ion introduction sequence through an SEC opening for the bipolar transistor structures. By way of example, the SEC opening in the 2.0 retro NWELL mask is formed with a horizontal area of approximately 10% and preferably in the range of 10% to 20% of the horizontal cross section area of the BCL. Relatively fast diffusing phosphorous atoms are implanted to an N+ concentration level through the 2.0 mask. Phosphorous atoms are used for the N+ concentration implant of the SEC and NWELL regions for faster up diffusion during subsequent annealing steps as hereafter described to provide retrograde concentrations extending into the subsequently deposited epitaxial layer EPI.

The 3.0 retro PWELL mask, etch, and P+ type dopant material introduction sequence or 3.0 retro PWELL mask sequence is used for defining and introducing the retro PWELL region of the CMOS/NMOS transistor structures and the channel stop regions CHST adjacent to the bipolar transistor structures. Boron atoms are implanted to a P+ concentration level in the PWELL and CHST regions. A single crystal epitaxial layer EPI of lightly doped N− type silicon is then deposited uniformly over the BICMOS IC structure in a blanket epitaxial deposition without a mask. An epitaxial oxide layer EPIOX and a first chemical vapor deposition CVD nitride layer are formed over the EPI.

Isolation oxide regions are established around the bipolar transistor structures using the 4.0 isolation oxide mask, etch and isolation oxide grow sequence. The collector sink region CS is defined by introducing an N+ concentration of phosphorous atoms using the 5.0 sink definition mask, etch and N+ type impurity ion introduction sequence. The 5.0 sink definition mask is also formed for introducing phosphorous atoms as a gettering agent in the isolation oxide regions ISOX. A second uniform CVD nitride layer is deposited in a blanket chemical vapor deposition across the BICMOS structure.

The 6.0 Active Area Definition Mask or Active Mask is formed for etching the second CVD nitride layer and defining the active regions of the CMOS transistor structure. The openings in the 6.0 photoresist active mask expose the framing field oxide regions FOX for framing and isolating the PMOS and NMOS transistor structures during the subsequent field oxide grow oxidation step.

At the same time the 6.0 active mask, etch and field oxide grow sequence also functions as the collector base surface spacer region CBSS definition mask, etch, and CBSS oxide grow sequence for the bipolar transistor structures. The 6.0 photoresist active area definition mask functioning as a CBSS mask also exposes the surface area between the collector and base of bipolar transistors for the CBSS. In the subsequent field oxidation step, the collector base surface spacer region CBSS between the collector and base of bipolar transistors is formed from field oxide rather than isolation oxide.

In the 7.0 active strip mask, etch, CMOS transistor voltage threshold ($V_T$) adjust, and gate oxide grow sequence steps, the second CVD nitride layer is stripped except over the bipolar transistor structures. In a series of subsequent steps the active areas of the CMOS transistor structures are opened to expose the epitaxial silicon as hereafter described in detail with reference to FIGS. 1-6. The gate oxide layer GOX is grown typically in a slow high temperature dry oxide process.

Gate material polysilicon (POLY) is subsequently deposited uniformly in one or two layers. The 8.0 poly gate definition mask and etch steps define the gates for CMOS transistors using a photoresist layer and photolithographic stepper sequence followed by etching the poly layer and leaving behind the poly gates over the gate oxide layer. A thin oxide layer referred to as a sealing oxide or spacer oxide is grown over the poly gates. A lightly doped source and drain N type dopant material introduction sequence such as an N− phosphorus implant initiates preparation of the profile of source and drain regions of CMOS transistors.

The 9.0 base definition mask, etch and introduction sequence is used for defining and introducing P type boron atoms for the base of the bipolar transistor structure. The base is implanted through the second CVD nitride layer which functions as a base implant screen. The 10.0 nitride etch mask provides a collector, base and emitter contact definition mask using the second CVD nitride layer and forming a self-aligned transistor (SAT) CVD nitride mask over the bipolar transistor structure. The epitaxial oxide layer EPIOX remains over the bipolar transistor structure with the CVD nitride SAT mask defining the collector, base and emitter contacts.

The 11.0 emitter definition and collector sink introduction mask is constructed to utilize the underlying CVD nitride SAT mask over the bipolar transistor structure. The emitter and collector sink regions are implanted to an N+ concentration level with N type arsenic atoms. While previous annealing steps have begun development of the retrograde concentration upward from the PWELL, NWELL, and the SEC region, the subsequent emitter annealing step following implant of the emitter and collector sink regions fully develops most of the retrograde concentration profile of dopant atoms.

The 12.0 N+S/D source/drain mask, etch and N+ type impurity ion introduction sequence for the NMOS transistor elements provides an N+ phosphorus implant over the previous lightly doped drain N− phosphorus implant in the source and drain regions. The combination of the N− and N+ phosphorous implants develops a profiled lightly doped drain for the NMOS transistor element of the CMOS transistor pairs. The 13.0 P+S/D source/drain mask, etch and P+ type dopant material introduction sequence is used for implanting the source and drain regions of the PMOS transistor structure.

Following the source/drain mask, etch and dopant material introduction sequences for the NMOS and PMOS transistor elements of the CMOS transistor structure, a blanket low temperature oxide layer LTO is deposited over the BICMOS structure. The 14.0 CMOS contact definition mask and etch sequence removes the LTO over the CMOS metal contact areas and over the bipolar transistor structure. The SAT CVD nitride mask on the bipolar transistor structures is finally etched for defining the bipolar transistor metal contact areas. In subsequent mask steps the first metal layer is deposited and then selectively etched using the 15.0 Metal 1 or M1 definition mask and etch sequence for defining M1 metal contacts, followed by blanket deposition of an interlayer dielectric (ILD). The ILD is masked and etched using the 16.0 VIA mask to define the locations of interlayer contacts followed by blanket deposition of the second metal layer. The 17.0 Metal 2 or M2, definition mask and etch sequence defines the M2 metal contacts. A passivation layer such as a PECVD layer is deposited over the BICMOS structure and the final 18.0 passivation mask and etch sequence cuts holes in the PECVD layer for bond pads.

Figure 1:
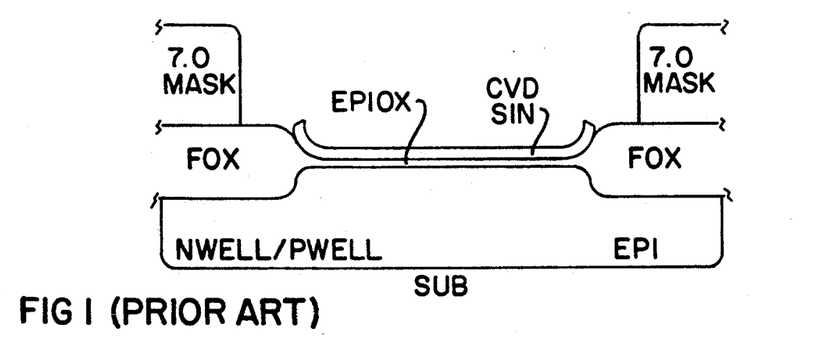
FIGS. 1-6 are simplified fragmentary diagrammatic views through a CMOS transistor active area of a die on a wafer during fabrication showing the standard active strip mask, etch, $V_T$ adjust and gate oxide grow sequence process steps of the prior art.

The standard CMOS transistor 7.0 active strip mask, etch, $V_T$ adjust, and gate oxide grow sequence of steps is described in further detail with reference to FIGS. 1-6. The CMOS transistor active area strip mask is referred to simply as the active strip mask and is designated 7.0 MASK in FIG. 1. The 7.0 MASK is a photoresist mask which exposes the active area of CMOS transistors for etching and stripping the second chemical vapor deposition nitride layer CVDSIN and the underlying epitaxial oxide layer EPIOX. As shown in FIG. 1, an NWELL or PWELL underlies the active area according to whether the CMOS transistor is a PMOS transistor or NMOS transistor respectively. The NWELL or PWELL forms a retrograde concentration of N type or P type dopant material in the epitaxial layer EPI formed over the substrate SUB of, for example, P type silicon. In a BICMOS process, the CVD nitride layer CVDSIN is the second nitride layer deposited over the EPIOX of the CMOS transistor active areas. It is formed prior to the 6.0 active area definition or field oxide definition mask, etch and field oxide grow sequence. The field oxide regions FOX frame the active areas of the CMOS transistors.

According to a conventional CMOS IC fabrication process for preparing CMOS transistors, the nitride layer CVDSIN is typically formed with a thickness in the range of 1,200A-1500A (angstrom units). The nitride layer is formed by a uniform chemical vapor deposition across the CMOS wafer prior to the CMOS active area definition mask, etch and field oxide grow sequence. In the active area definition mask and etch sequence the epitaxial layer EPI is exposed around the CMOS transistor active areas for growing the field oxide FOX that frames and isolates the respective PMOS and NMOS transistors. The nitride layer CVDSIN is formed over the epitaxial oxide layer EPIOX of the CMOS transistor active areas. The EPIOX was formed after epitaxial deposition of the EPI layer following the NWELL and PWELL definition mask, etch and dopant material introduction sequences. The EPIOX is typically formed to a thickness of, for example 400A to 500A. The ratio of thickness of the respective layers CVDSIN/EPIOX is therefore conventionally in the range of 3/1 to 4/1.

In a pure CMOS IC fabrication process, a photoresist mask is typically not required for the following active strip, voltage threshold $V_T$ adjust, and gate oxide grow sequence illustrated in FIGS. 1-6. This is because the 7.0 MASK is not required to protect the nitride layer CVDSIN over adjacent bipolar transistor active areas. For integration of the CMOS transistor preparation steps into a BICMOS IC fabrication process, the 7.0 active strip mask sequence is required to protect bipolar transistor active areas. Also, in a full BICMOS process, the nitride layer CVDSIN illustrated in FIG. 1 is in fact the second CVD nitride layer. A first CVD nitride layer is required for the 4.0 isolation oxide mask, etch and ISOX grow sequence and this first CVD nitride layer is stripped prior to other bipolar steps. The second CVD nitride layer CVDSIN, illustrated in FIG. 1 is conventionally deposited to a thickness, of for example 1275A over EPIOX in the range of approximately 400A as in the case of conventional CMOS transistor preparation steps. The ratio of CVDSIN/EPIOX therefore conventionally falls in the range of 3/1 to 4/1 for both CMOS and BICMOS standard fabrication processes.

Figure 2:
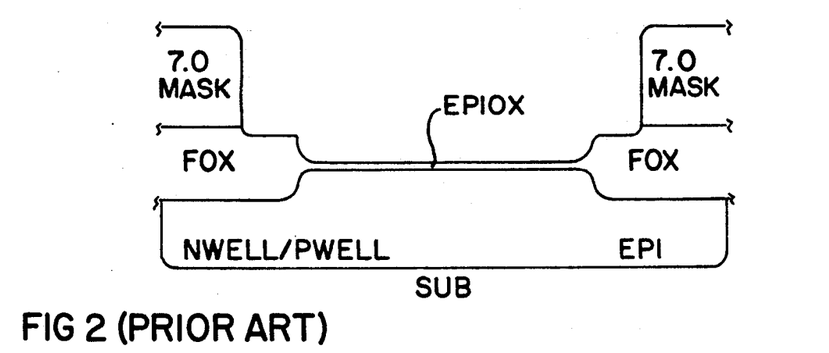
Figure 3:
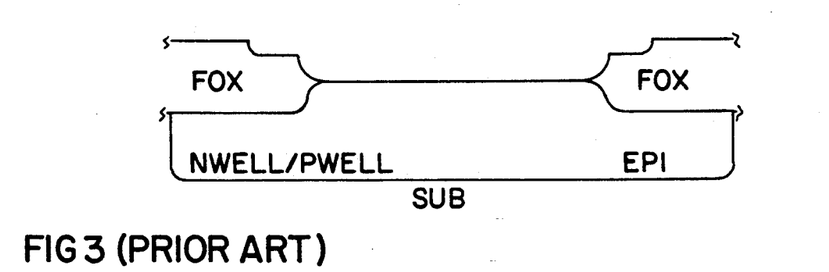

As shown in FIG. 2, the nitride layer CVDSIN is stripped from the CMOS transistor active areas in a nitride etch exposing the EPIOX layer. The epitaxial oxide layer EPIOX, also known as the pad oxide layer or PADOX layer is then removed in an oxide etch or dip. Following stripping of the CVDSIN and EPIOX layers from the CMOS transistor active areas, the photoresist 7.0 MASK is also stripped exposing the second nitride layer CVDSIN over bipolar transistor active areas at the same time that the epitaxial silicon EPI is exposed over the respective NWELL and PWELL active areas of the PMOS and NMOS transistors.

Figure 4:
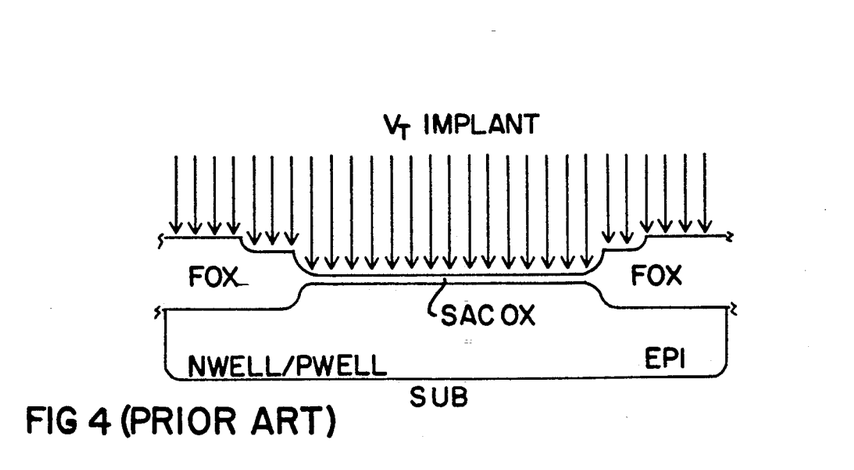

According to the conventional gate oxide sequence that begins with the 7.0 active strip mask and etch sequence, a sacrificial oxide layer SACOX, also known as a pregate oxide layer, is grown in an oxide grow thermal cycle over the exposed EPI of the NWELLs and PWELLs of PMOS and NMOS transistors. The SACOX grow thermal cycle is followed by a blanket implant of boron ions as illustrated in FIG. 4 for adjusting the voltage threshold $V_T$ of the CMOS transistors.

Figure 5:
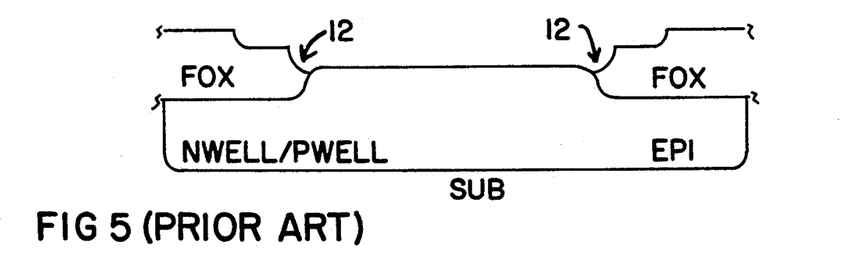
Figure 6:
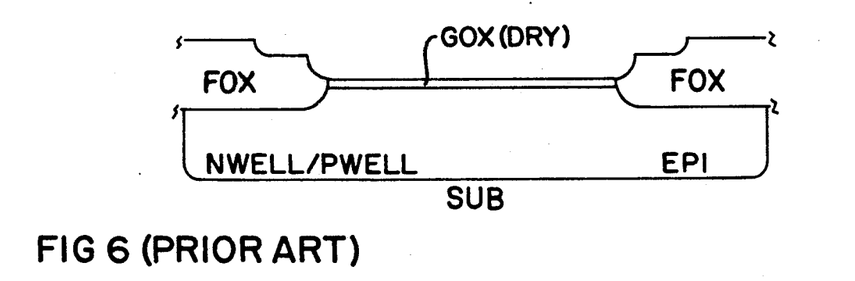

The sacrificial oxide layer SACOX is typically grown to a thickness of, for example, 400A. The SACOX growth followed by stripping is intended to provide an extremely clean EPI surface for tight control of the gate oxide thickness grown in subsequent steps. The SACOX layer also provides a screen oxide layer for the $V_T$ adjust implant and is then stripped as illustrated in FIG. 5. A thin gate oxide layer GOX is grown to a thickness of, for example, 150A in a tightly controlled slow growth dry oxygen process at high temperature. For example, the dry oxide GOX is typically grown at a temperature in the range of 900° C. to 1000° C. As used herein, the reference to "high temperature" or "relatively high temperature" for the thermal cycles of the fabrication steps generally refers to a temperature of 900° C. or greater, while a temperature indicated to be at "relatively low temperature" generally refers to a temperature below 900° C. A dry oxide GOX thermal cycle is generally required for slow growth to achieve the tightly controlled critical thickness of, for example, 150° A for the gate oxide layer. The dry oxide process in turn requires the relatively high temperatures in the range of 900° to 1000° C.

A number of problems are associated with the standard active strip mask, etch, $V_T$ adjust, and gate oxide grow sequence illustrated in FIGS. 1-6. First, the inventors have determined that the conventional nitride layer CVDSIN in the range of 1200A to 1500A formed over the relatively thin EPIOX layer of 400A to 500A introduces substantial differential stresses at the silicon/silicon dioxide (Si/SiO$_2$) interfaces particularly in the bipolar transistor structures. The relatively thick CVD nitride layer stresses induce crystal lattice defects in the epitaxial silicon particularly in the vicinity of nitride and silicon dioxide interfaces. Such crystal lattice defects or holes become gettering centers for contaminants which change the conductivity specifications of the semiconductor material. This effect is increased by the subsequent thermal cycles and high temperatures of the conventional gate oxide sequence as silicon crystal lattice defects propagate into the substrate under thermal stress.

Such differential stress and thermal stress induced silicon defects cause substantial reduction in the yield of acceptable dies from the BICMOS wafer. Such defects are manifested in collector to base leakage current flow along lattice defect paths across the collector base junction. Bipolar leakage current exceeding specifications may reduce the yield of acceptable dies on a BICMOS wafer by 20% and in the extreme to a yield as little as 5%.

A second disadvantage of the conventional gate oxide sequence set forth in FIGS. 1-6 is that the SACOX loop or SACOX cycle causes substantial nonuniformity in the nitride layer CVDSIN over bipolar transistor structures. Growing the sacrificial oxide layer and subsequently stripping the sacrificial oxide layer following the $V_T$ adjust implant takes place while the nitride layer CVDSIN is exposed over the bipolar transistor structure. The impacted nitride layer provides the implant screen layer for the subsequent 9.0 base definition mask, etch and P type dopant material introduction sequence. The selected thickness of the CVD nitride layer establishes the $\beta$ (amplification) for the bipolar transistors and a uniform nitride layer is essential to maintaining the $\beta$ specification across the wafer. The resulting nonuniformities in the nitride layer CVDSIN across the bipolar transistors may cause unacceptable variation in the $\beta$ of bipolar transistors.

A third disadvantage of the prior art gate oxide sequence of FIGS. 1-6 is the excessive manufacturing cycle time required by the gate oxide process of FIGS. 1-6 and related BICMOS IC fabrication steps impacted by the gate oxide sequence. For example, the SACOX grow and strip loop adds an oxide grow thermal cycle at relatively high temperature. However it is essential in order to achieve acceptable reliability for the gate oxide layer grown in a slow dry oxide process. That is, it is essential to assure the extremely clean epitaxial silicon over the active area for tight control of gate oxide specifications. Furthermore, the dry oxide growth is a slow process believed necessary for tight control of gate oxide thickness. However it results in a prolonged thermal cycle at high temperatures. A related fourth disadvantage of the conventional gate oxide sequence is the number of thermal cycles and prolonged thermal cycles at high temperatures which increase thermal stress and propagation of stress induced silicon crystal defects.

A fifth disadvantage is that annealing of the gate oxide layer occurs as an integral part of the gate oxide process loop at the end of the sequence with a short annealing ramp in temperature in the range for example of 900° C. to 950° C. This abbreviated annealing step cannot achieve the full potential of annealing densification of the gate oxide layer to provide the maximum potential of gate oxide integrity and reliability.

A sixth disadvantage of the conventional gate oxide sequence is that the process steps result in excessive loss of nitride from the nitride layer CVDSIN and excessive loss of field oxide at the field oxide regions. These losses occur at two steps of the BICMOS process and require compensating increase in thickness of the CVDSIN layer and the field oxide region when initially formed. As previously noted, the SACOX grow and strip cycle produces nonuniform topography of the CVD nitride layer over bipolar transistors. It also produces an absolute loss of nitride from the CVD nitride layer impairing the $\beta$ specification for bipolar transistors. Of greater significance, the nitride loss from the nitride layer CVDSIN during the SACOX cycle removes a thin layer of oxidized nitride or nitrox formed over the nitride layer during the field oxide grow sequence. The stripping of the sacrificial oxide SACOX also removes the nitrox layer. The inventors determined that this nitrox layer provides significant protection for the underlying nitride layer CVDSIN during the subsequent polyetch.

The second process step at which nitride loss and field oxide loss occurs is during the poly gate definition mask and etch sequence. Following the 7.0 active strip mask, etch, $V_T$, adjust, and gate oxide grow sequence, a uniform polycrystalline silicon layer is deposited over the wafer. The uniform polysilicon layer is then patterned and etched in the polygate definition mask and etch sequence leaving behind the polygates over the CMOS transistor active areas. An overetch is required to assure removal of the polycrystalline silicon at locations outside the polygates resulting in nonuniform loss of, for example, as much as 100A to 200A nitride. The combined losses from the SACOX cycle and polyetch may be as great as 20% of the nitride layer CVDSIN. Similarly the loss in field oxide may be as great as 900A. As a result greater CVD nitride must be afforded at the outset to maintain the $\beta$ of bipolar transistors, and greater field oxide thickness is required to meet field oxide specifications.

OBJECTS OF THE INVENTION

It is therefore an object of the present invention to provide a new gate oxide process which permits thinning of the CVD nitride layer CVDSIN in order to reduce occurrence of differential stress induced silicon crystal lattice defects caused by the CVD nitride layer. According to the invention the overall thickness of the combined nitride layer CVDSIN and underlying epitaxial layer EPIOX is selected to provide an implant screen which maintains the desired $\beta$ for bipolar transistors during the subsequent base implant. However the invention selects a novel ratio of thicknesses CVDSIN/EPIOX to optimize reduction of silicon crystal lattice defects and oxide encroachment into the epitaxial layer.

Another object of the invention is to provide a new gate oxide BICMOS process which preserves uniformity of the CVD nitride layer over bipolar transistors in order to maintain uniformity of the $\beta$ amplification parameter of the bipolar transistors during base implant through the nitride layer.

Other related objects of the invention include providing a BICMOS IC fabrication process with an improved gate oxide sequence which substantially reduces production cycle time for BICMOS wafers and which substantially lowers temperatures and shortens the thermal budget in rapid thermal cycles while maintaining integrity and reliability of gate oxide in CMOS transistors.

A further object of the invention is to provide integration of CMOS and bipolar fabrication process steps for enhancing the annealing, densification and healing of the gate oxide layer and gate oxide interfaces.

The invention also seeks to reduce losses from the CVD nitride layer and field oxide regions during gate oxide process steps and related BICMOS IC fabrication steps to reduce thickness requirements during formation of the CVD nitride layer CVDSIN and field oxide regions FOX. The invention also seeks to provide new gate oxide sequence process steps applicable for improving pure CMOS processes as well as BICMOS IC fabrication.

DISCLOSURE OF THE INVENTION

In order to accomplish these results the present invention provides a new wafer fabrication process including CMOS fabrication steps for fabricating CMOS transistors in a substrate of semiconductor material. The background process steps include an NWELL definition mask, etch, and N type dopant material introduction sequence and a PWELL definition mask, etch and P type dopant material introduction sequence for forming wells in the substrate. The process proceeds by growing an epitaxial layer EPI of semiconductor material over the substrate, growing an epitaxial oxide layer EPIOX over the EPI layer, and depositing by chemical vapor deposition a CVD nitride layer CVDSIN over the EPIOX layer. A CMOS transistor active area definition mask, etch, and field oxide FOX grow sequence frames the CMOS transistor active areas of the EPI layer in FOX.

The invention provides an improved CMOS active strip mask, etch, $V_T$ adjust and gate oxide grow sequence by forming a photoresist CMOS active strip mask exposing CMOS transistor active areas, etching and removing the CVD nitride layer over the CMOS transistor active areas, and leaving the EPIOX layer. Further steps include introducing dopant material through the EPIOX layer into the CMOS transistor active areas with the photoresist active strip mask in place for adjusting the threshold voltage $V_T$ of the CMOS transistors. The invention proceeds by stripping the EPIOX layer over the CMOS transistor active areas without growing a sacrificial oxide SACOX layer, and then removing the photoresist CMOS active strip mask. This step is followed by growing a gate oxide GOX layer over the CMOS transistor active areas using a wet oxide grow process at relatively lower temperature than a dry oxide grow process.

In the preferred application, the wafer fabrication process incorporates bipolar fabrication steps in a BICMOS process for fabricating bipolar transistors in the substrate of semiconductor material. The bipolar fabrication steps include an emitter definition mask, etch, and N type dopant introduction sequence followed by an emitter anneal step at relatively high temperature. These steps are all subsequent to the CMOS active strip mask, etch, $V_T$ adjust, and gate oxide grow sequence as well as the poly gate definition mask and etch sequence. The invention provides the beneficial step of annealing the GOX layer at said relatively high temperature during the emitter anneal step in a relatively rapid thermal cycle.

The bipolar fabrication steps further include a base definition, mask, etch and P type dopant introduction sequence for implanting the base of the bipolar transistors through the nitride layer CVDSIN. The steps of the invention include forming the combined thicknesses of the nitride layer CVDSIN and epitaxial oxide layer EPIOX to provide the control screen necessary for controlling the base implant to maintain a desired $\beta$ specification for bipolar transistors. More importantly the invention incorporates the step of forming the layers in a thickness ratio CVDSIN/EPIOX in the range of approximately 5/3 or smaller. For example, the CVDSIN layer is formed in a preferred thickness range of 900A to 1000A while the EPIOX layer is formed in a preferred thickness range of 600A to 750A. The preferred thickness ratio CVDSIN/EPIOX is selected to be in the range of approximately 3/2 or smaller thereby achieving current leakage test yields of 90%-95% and greater.

An advantage of the new gate oxide process is that elimination of the SACOX cycle maintains the uniformity of the CVD nitride layer and preserves the silicon nitrox layer across the top of the CVD nitride layer. As a result during the subsequent poly gate mask and etch sequence, the CVD nitride layer is protected during etching of the polycrystalline silicon preserving most of the uniformity and thickness of the original CVD nitride layer. As a result the CVD nitride layer may be thinned during its formation to the minimum original thickness necessary to maintain in combination with a thickened EPIOX layer the desired $\beta$ specification for bipolar transistors while minimizing differential stress induced silicon crystal lattice defects in the epitaxial silicon.

In the preferred example of the invention, gate oxide is grown in a faster wet oxide grow process and at a relatively lower temperature than a dry oxide process. The inventors have found that the faster wet oxide grow process at relatively low temperature of for example 850° C. can achieve the desired specification for the gate oxide layer GOX without the necessity of a SACOX cycle. The result is an overall reduction of the manufacturing time cycle as well as reduction in the temperatures of thermal cycles or the time at high temperatures during thermal cycles. For example the gate oxide is grown in a wet oxide process at the relatively low temperature of 850° C. with a final ramp up in temperature up to 950° C. and ramp down to relatively low temperature in a rapid thermal cycle. High temperature annealing of the gate oxide layer is postponed until after deposition of the poly layer and other BICMOS process steps during the subsequent bipolar emitter anneal thermal cycle. An advantage of the tempered thermal budget of the new gate oxide process is that thermally induced propagation of silicon crystal defects is minimized.

Other objects, features and advantages of the invention are apparent in the following specification and accompanying drawings.

BRIEF DESCRIPTION OF THE DRAWINGS

FIG. 12A is a graph showing the gate oxide grow thermal cycle of the present invention while

DESCRIPTION OF PREFERRED EXAMPLE EMBODIMENTS AND BEST MODE OF THE INVENTION

Figure 7:
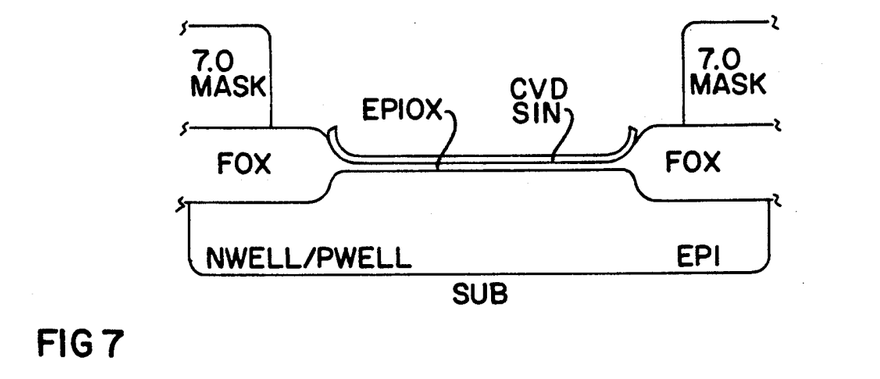
FIGS. 7-11 are simplified fragmentary diagrammatic views through a CMOS transistor active area on a die of a wafer under fabrication illustrating the new active strip mask, etch, $V_T$ adjust, and gate oxide grow sequence process steps of the present invention.

The new gate oxide sequence process steps according to the invention are illustrated in FIGS. 7-11. The active strip mask sequence begins with patterning of the photoresist 7.0 MASK as illustrated in FIG. 7. FIG. 7 is similar to FIG. 1 with the following notable differences. The nitride layer CVDSIN and underlying epitaxial oxide layer EPIOX are previously formed over the epitaxial layer EPI with different thicknesses and more importantly with a different ratio of layer thicknesses CVDSIN/EPIOX than in the conventional configuration of FIG. 1. According to the new process, the EPIOX layer is grown to a greater thickness and the CVDSIN is deposited in a thinner layer over the EPI in comparison with the conventional configuration parameters described with reference to FIG. 1.

The epitaxial layer is deposited and prepared with the new configuration of overlying EPIOX and CVDSIN layers at the same stage in the BICMOS fabrication process as described with reference to TABLE I. That is, the epitaxial layer EPI is deposited and prepared with the epitaxial oxide layer EPIOX and CVD nitride layer CVDSIN following the 3.0 retro NWELL mask, etch and P+ type dopant material introduction sequence and prior to the 4.0 isolation oxide mask, etch and ISOX grow sequence.

In contrast to the conventional CVDSIN layer of 1200A-1500A of FIG. 1, the CVDSIN layer of FIG. 7 is substantially thinned to a thickness in the range of 900A-1000A, for example 950A. In the preceeding epitaxial oxidation step, the EPIOX layer is thickened from the conventional range of 400A-500A identified with reference to FIG. 1 to a new range of 600A-700A, for example 600A. Thinning of the CVDSIN layer and thickening the EPIOX layer substantially reduces the differential stresses which initiate silicon crystal lattice defects at interfaces. At the same time, the combined effective screen thickness of the EPIOX and CVDSIN layers is selected to maintain specified $\beta$ for bipolar transistors during the subsequent 9.0 base definition mask, etch and base implant through the CVDSIN and EPIOX layers. The CVDSIN thinning substantially reduces the source of differential stress while the EPIOX thickening also substantially improves the stress reduction buffer layer. It has been found that thickening the EPIOX layer by 1A is equivalent to a 2A thinning of the CVDSIN layer in the effect on defect generating stress. Reduction of the CVD nitride layer thickness from e.g. 1350A to 950A accompanied by the increase in the EPIOX thickness from 400A to 600A therefore greatly improves stress relief while providing a desired implant screen for maintaining a specified $\beta$ for bipolar transistors.

It has been found that the benefits of the present invention are best achieved by providing a ratio of layer thicknesses CVDSIN/EPIOX of approximately 5/3 or smaller and preferably 3/2 and smaller. This is to be contrasted with the conventional ratio range of 3/1 to 4/1. By shifting to the ratio range of the present invention, unacceptable bipolar transistor collector base current leakage caused by silicon lattice defects at interfaces is substantially reduced and even eliminated. Acceptable leakage current test results are increased from the 5%-20% range to 90%-95% range and greater using the CVDSIN/EPIOX layer thickness ratios of the present invention. With a CVDSIN layer of 950A over an EPIOX layer of 700A, acceptable leakage current test results referred to as CBO parametric test yields exceed 95%.

A limiting factor in the absolute thickness reduction for the CVDSIN layer and thickening of the EPIOX layer is the quantity of EPI silicon consumed in the epitaxial oxidation. Limiting encroachment into silicon to acceptable limits the lower end of the CVDSIN-/EPIOX layer thickness ratio to approximately 1. For example the limit of EPIOX thickness may be in the range of 700A to 800A for an EPI layer of $1.3\mu$ in order to limit encroachment into silicon to an acceptable quantity.

Figure 8:
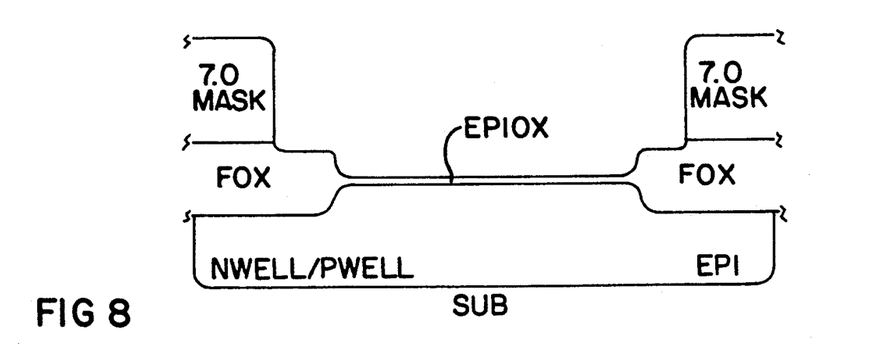
Figure 9:
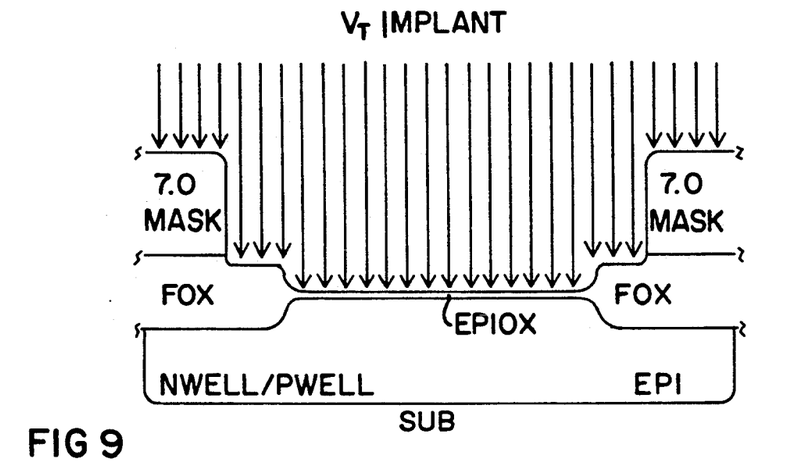
Figure 10:
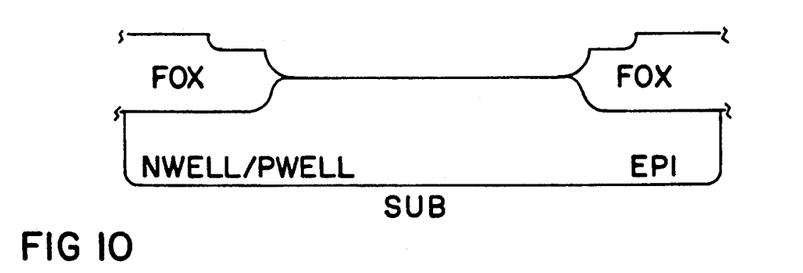

After the photoresist active strip 7.0 MASK is in place, the nitride layer CVDSIN is removed across the active areas of CMOS transistors leaving in place the underlying EPIOX layer as shown in FIG. 8. As noted above, the EPIOX layer is sometimes referred to as the PADOX layer. According to the present invention the SACOX cycle of the conventional gate oxide sequence illustrated in FIGS. 1-6 is eliminated. The EPIOX layer is retained in place, a high temperature thermal cycle is eliminated, and the EPIOX layer provides the implant screen for the $V_T$ adjust implant as illustrated in FIG. 9. After adjusting the voltage threshold of CMOS transistor active areas, the EPIOX layer is then stripped in an oxide etch or dip exposing the epitaxial silicon across the active areas of CMOS transistors as shown in FIG. 10. The photoresist 7.0 MASK is then removed, exposing the CVDSIN layer over bipolar transistors.

It is important to note that by eliminating the SACOX thermal cycle and SACOX sequence, the process of FIGS. 7-11 avoids the substantial loss of nitride and field oxide that occurs during removal of the sacrificial oxide layer. For example, nitride loss as great as 200A is avoided. The process of FIGS. 7-11 also avoids the resulting nonuniformity of the CVD nitride layer CVDSIN which also causes nonuniformity in the $\beta$ specification of bipolar transistors during the subsequent base mask, etch and base implant which takes place through the CVDSIN layer. Furthermore the elimination of the SACOX cycle eliminates the trenches or indentations 12 along the field oxide edges caused by stripping of the sacrificial oxide. Conductive material such as polysilicon may accumulate in the indentations 12 resulting in conductive "stringers" which cause further current leakage.

Figure 11:
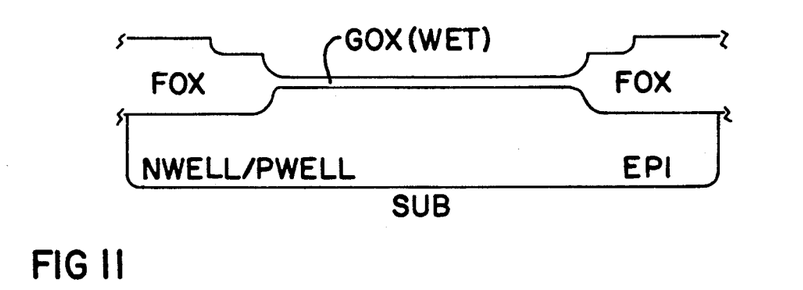
Figure 12A:
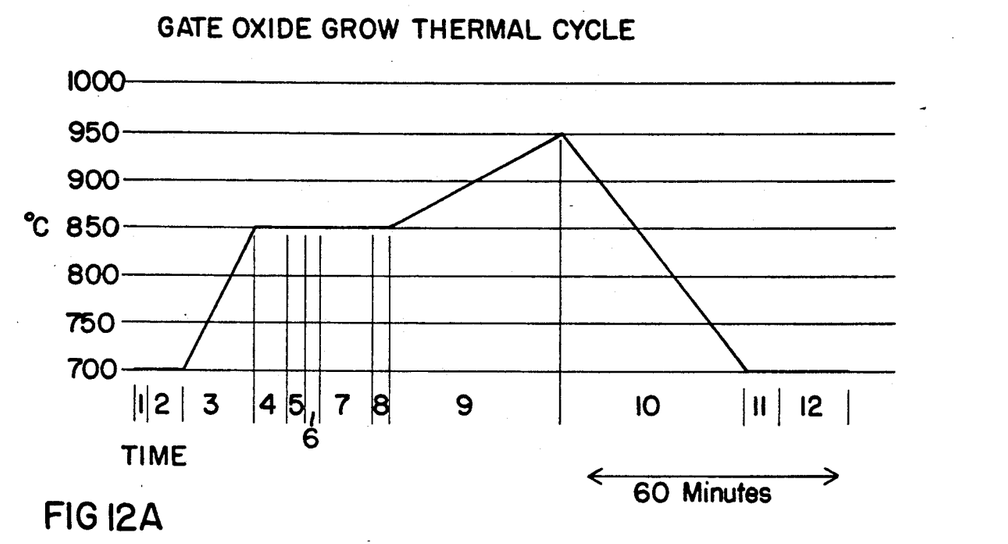

To accommodate the elimination of the SACOX cycle, new gate oxide grow steps are implemented for growing the gate oxide layer GOX as shown in FIG. 11. The gate oxide is grown in a wet oxide process with a relatively shorter cycle time and relatively lower temperature and thermal budget in comparison with the relatively slow high temperature dry gate oxide process used in the conventional method of FIGS. 1-6. The gate oxide grow thermal cycle according to the invention is illustrated in FIG. 12A with the detailed steps summarized in Table II. Basically, the gate oxide is grown to a thickness of, for example, 150A in a relatively rapid wet gate oxide process at the relatively low temperature of 850° C. followed by a rapid thermal cycle ramp to 950° C. and return to the lower temperatures.

TABLE II

| GATE OXIDE GROW THERMAL CYCLE | |
|---|---|
| Step | Description |
| 1 | 1 min Argon Purge prior to PUSH at room |

TABLE II-continued

| GATE OXIDE GROW THERMAL CYCLE | |
|---|---|
| Step | Description |
| | temp - Argon (16.0) |
| 2 | 10 min PUSH at 700° C. - Argon (16.0) |
| 3 | 20 min RAMP to 850° V. at 10° C. per minute - Argon (16.0) |
| 4 | 10 min temperature STABILIZE at 850° C. - Argon (16.0) |
| 5 | 5 min Oxygen PURGE - Argon (1.6),02(8.0) |
| 6 | 4.5 min Pyrogenic Steam OXIDATION - 02(8.0), H2(13.6), TCA(0.55) |
| 7 | 25 min Dry TCA Oxygen (set Cl peak) - 02(8.0),TCA(0.55) |
| 8 | 3 min Oxygen PURGE - 02(8.0) |
| 9 | 55 min ANNEAL ramp to 950° C. at 1.82° C. per minute - Argon (16.0) |
| 10 | 50 min COOL to 700° C. at 5° C. per minute - Argon (16.0) |
| 11 | 10 min PULL at 10" per minute - Argon(16.0) |
| 12 | 20 min COOL to room temp - Argon(16.0) |

A further advantage of the process of FIGS. 7-11 occurs in the subsequent 8.0 polygate definition mask and etch sequence. By eliminating the SACOX cycle, the protective nitrox layer across the nitride layer CVDSIN over bipolar transistors is preserved. It has been found that the nitrox layer provides substantial protection from the subsequent polysilicon etch. The polysilicon etch is an overetch to assure removal of polysilicon in all areas outside the polygates of CMOS transistors. Substantial further loss from the CVD nitride layer CVDSIN is therefore avoided during the subsequent polyetch. The reduction in losses from the CVDSIN layer and the field oxide regions eliminates the requirement for compensating incremental thickness of these elements during the BICMOS IC fabrication process.

Overall the new gate oxide process steps of FIGS. 7-11 eliminate approximately 16 hours of production cycle time including high temperature thermal cycles which aggravate thermal stress induced silicon defects and propagation of defects. Leakage current test yields improve from the 5%-20% range to over 90% and in excess of 95% according to the selected CVDSIN-/EPIOX layer thickness ratio.

While the SACOX cycle is a necessary concomitant of the prior art high temperature dry oxide process for slow controlled growth of gate oxide, the relatively low temperature wet oxide process with faster growth of gate oxide is a concomitant of the SACOX cycle elimination according to the invention. The combination of eliminating the SACOX cycle and introducing the wet oxide process for growing gate oxide substantially improves the die yield. Furthermore the gate oxide integrity and reliability achieved by the wet gate oxidation process without sacrificial oxide is equal to or exceeds the gate integrity achieved by the dry gate oxidation with the sacrificial oxide cycle. Comparative experimental results for gate oxide integrity are summarized in Table III.

TABLE III

| GATE OXIDE INTEGRITY EXPERIMENTAL RESULTS | | |
|---|---|---|
| Gate Oxide Process | BVGox Results (Gate Oxide Breakdown Voltage) (volts) | IGMaxN Results (Gate Oxide Current at Breakdown) ($\mu$A) |
| Dry gate w/Sac Ox | −16.0 | −500 to −800 |
| Wet gate w/Sac Ox | −17.0 | −0.0 to −1900 |

TABLE III-continued

GATE OXIDE INTEGRITY EXPERIMENTAL RESULTS

| Gate Oxide Process | BVGox Results (Gate Oxide Breakdown Voltage) (volts) | IGMaxN Results (Gate Oxide Current at Breakdown) (μA) |
|---|---|---|
| Wet gate w/out Sac Ox | −17.2 | −1300 to −2100 |

As a result of adopting the process of FIGS. 7-11, further nitride loss from the CVDSIN layer is minimized during the subsequent 8.0 polygate definition mask and etch sequence. The nitrox layer preserved over the CVDSIN layer provides protection from the over etch of polysilicon. In the following 9.0 base definition mask, etch and base implant through the CVDSIN layer, the specification for $\beta$ of bipolar transistors is maintained by the uniformity of the CVDSIN layer and the composite thickness and ratio of the CVDSIN/EPIOX base implant screen.

Following the 10.0 nitride etch mask which provides an SAT collector, base, and emitter contact definition mask, elements of the 11.0 emitter definition mask sequence are integrated into the BICMOS gate oxide process. The high temperature emitter anneal at 1000° occurs at an opportune stage for a gate oxide anneal also. The emitter anneal occurs after the polygate is formed over the GOX layer. Furthermore it occurs before the 12.0 and 13.0 CMOS source/drain mask, etch and implant sequences so that a higher temperature anneal can be used. Generally high temperature thermal cycles in pure CMOS IC fabrication must be limited to no greater than 900° C.-950° C.

Figure 12B:
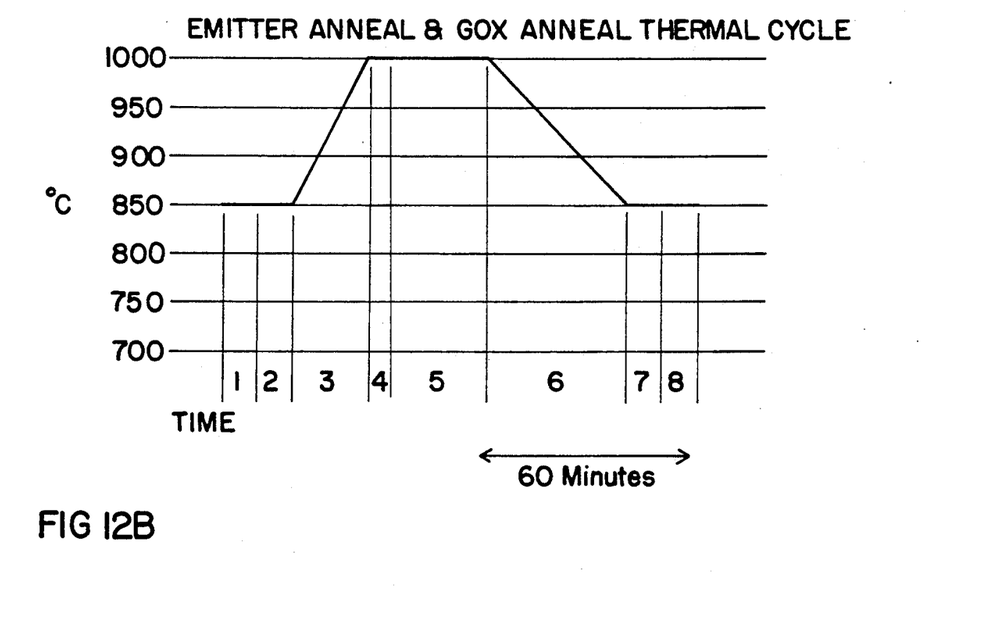
FIG. 12B is a graph showing the GOX layer anneal thermal cycle which coincides with the emitter anneal thermal cycle.

The high temperature emitter anneal thermal cycle heals the interfaces of the GOX layer with underlying silicon and overlying polysilicon, densifies the GOX layer, and optimizes the reliability and integrity potential for the GOX layer. The bipolar emitter anneal thermal cycle is therefore integrated into the BICMOS process to function also as the GOX anneal thermal cycle as illustrated in FIG. 12B. The detailed process steps in the emitter anneal and GOX anneal thermal cycle are summarized in Table IV.

TABLE IV

EMITTER ANNEAL & GOX ANNEAL THERMAL CYCLE

| Step | Description |
|---|---|
| 1 | 10 min PUSH at 850° C. - N2 (8.0) |
| 2 | 10 min STABILIZE at 850° C. - N2 (8.0) |
| 3 | 19 min RAMP to 1000° C. at 7.9° C./min - N2(8.0) |
| 4 | 5 min Temp STABILIZE/DRIVE 1000° C. - N2(8.0) |
| 5 | 25 min DRIVE at 1000° C. - N2(8.0) |
| 6 | 38 min RAMP to 850° C. at 3.9° C. per min - N2(8.0) |
| 7 | 10 min PULL at 15" per min - N2 (8.0) |
| 8 | 10 min COOL to room temp - N2 (2.0) |

The gate oxide process of the present invention finds its greatest benefit in a BICMOS IC fabrication process protecting bipolar transistors, maintaining the $\beta$ of bipolar transistors, and reducing collector base leakage current caused by silicon crystal lattice defects. However the invention also provides benefits to a CMOS IC fabrication process in reducing product cycle time, reducing thermal cycles at high temperature, and enhancing gate oxide integrity and reliability. While the invention has been described with reference to particular example embodiments it is intended to cover all modifications and equivalents within the scope of the following claims.

We claim:

1. A wafer fabrication process comprising CMOS fabrication steps for fabricating CMOS transistors in a substrate of semiconductor material including an NWELL definition mask, etch, and N type dopant material introduction sequence forming an NWELL in the substrate, a PWELL definition mask etch and P type dopant material introduction sequence forming a PWELL in the substrate, growing an epitaxial layer (EPI) of semiconductor material over the substrate, growing an epitaxial oxide layer (EPIOX) over the EPI layer, depositing by chemical vapor deposition (CVD) a nitride layer CVDSIN over the EPIOX layer, and a CMOS transistor active area definition mask, etch, and field oxide (FOX) grow sequence for framing CMOS transistor active areas of the EPI layer in FOX, an improved CMOS active strip mask, etch, $V_T$ adjust and gate oxide grow sequence comprising:

forming a photoresist CMOS active strip mask exposing CMOS transistor active areas, etching and removing the CVD nitride layer over the CMOS transistor active areas, and leaving the EPIOX layer;

introducing P type dopant material through the EPIOX layer into the CMOS transistor active areas with the photoresist active strip mask in place for adjusting the threshold voltage ($V_T$) of the CMOS transistors;

stripping the EPIOX layer over the CMOS transistor active areas without growing a sacrificial oxide SACOX layer and then removing the photoresist CMOS active strip mask;

and growing a gate oxide (GOX) layer over the CMOS transistor active areas using a wet oxide grow process at relatively lower temperature than a dry oxide grow process, said wet oxide grow process being at a temperature no greater than approximately 850° C. followed by anneal ramping of temperature to a relatively high temperature and return to a relatively low temperature in a rapid thermal cycle.

2. The wafer fabrication process of claim 1 comprising bipolar fabrication steps for fabricating bipolar transistors in the substrate of semiconductor material.

3. The wafer fabrication process of claim 2 wherein the bipolar fabrication steps include an emitter definition mask, etch and N type dopant introduction sequence followed by an emitter anneal step at relatively high temperature, all subsequent to the CMOS active strip mask, etch, $V_T$ adjust, and gate oxide grow sequence, and comprising:

annealing the GOX layer at said relatively high temperature during the emitter anneal step in a relatively rapid thermal cycle.

4. The wafer fabrication process of claim 2 wherein the bipolar fabrication steps include a base definition mask, etch and P type dopant introduction sequence implanting the base of bipolar transistors through the nitride layer CVDSIN and EPIOX layer and comprising:

forming the combined thickness of the nitride layer CVDSIN and epitaxial oxide layer EPIOX to provide the control screen for controlling the base implant to maintain a desired $\beta$ specification for bipolar transistors;

and forming the layers in a thickness ration CVDSIN/EPIOX in the range of approximately 5/3 or smaller.

5. The wafer fabrication process of claim 4 comprising forming the CVDSIN layer in the thickness range of 900A-1000A and forming the EPIOX layer in the thickness range of 600A-750A.

6. The wafer fabrication process of claim 4 wherein the thickness ratio CVDSIN/EPIOX is in the preferred range of 3/2 or smaller.

7. The wafer fabrication process of claim 4 wherein the CMOS fabrication steps include a polygate definition mask and etch sequence following the CMOS active strip mask, etch, $V_T$ adjust and gate oxide grow sequence, comprising:

forming a protective nitrox layer over the CVDSIN layer remaining over bipolar transistors during the FOX grow sequence;

preserving the protective nitrox layer during the CMOS active strip mask, etch, $V_T$ adjust, and gate oxide grow sequence;

and exposing the protective nitrox layer over the nitride layer CVDSIN during the polygate definition mask and etch sequence for protecting the nitride layer CVDSIN during the poly etch.

8. The wafer fabrication process of claim 2 wherein the CMOS fabrication steps include a polygate definition mask and etch sequence following the CMOS active strip mask, etch, $V_T$ adjust and gate oxide grow sequence, comprising:

forming a protective nitrox layer over the CVDSIN layer remaining over bipolar transistors during the FOX grow sequence;

preserving the protective nitrox layer during the CMOS active strip mask, etch, $V_T$ adjust, and gate oxide grow sequence;

and exposing the protective nitrox layer over the nitride layer CVDSIN during the polygate definition mask and etch sequence for protecting the nitride layer CVDSIN during a polyetch.

9. The wafer fabrication process of claim 1 wherein the step of ramping of temperature comprises ramping the temperature to no greater than approximately 950° C. and returning to a relatively low temperature.

10. A wafer fabrication process comprising CMOS fabrication steps for fabricating CMOS transistors and bipolar fabrication steps for fabricating bipolar transistors in a substrate of semiconductor material including growing an epitaxial layer (EPI) of semiconductor material over the substrate, growing an epitaxial oxide layer (EPIOX) over the EPI layer, depositing by chemical vapor deposition a (CVD) nitride layer CVDSIN over the EPIOX layer, a CMOS transistor active area definition mask, etch, and field oxide (FOX) grow sequence for framing CMOS transistor active areas of the EPI layer in FOX, a base definition mask, etch and P type dopant material introduction sequence forming the base of bipolar transistors through the nitride layer CVDSIN, an improved CMOS active strip mask, etch, $V_T$ adjust and gate oxide grow sequence comprising:

etching and removing the CVD nitride layer over the CMOS transistor active areas, and leaving the EPIOX layer;

introducing dopant material through the EPIOX layer into the CMOS transistor active areas for adjusting the threshold voltage ($V_T$) of the CMOS transistors;

stripping the EPIOX layer over the CMOS transistor active areas without growing a sacrificial oxide SACOX layer;

growing a gate oxide (GOX) layer over the CMOS transistor active areas using a wet oxide grow process at relatively lower temperature than a dry oxide grow process;

a base definition mask, etch and P type dopant material introduction sequence forming the base of bipolar transistors through the nitride layer CVDSIN;

forming the combined thickness of the nitride layer CVDSIN and epitaxial oxide layer EPIOX to provide a control screen for controlling the base implant to maintain a desired $\beta$ specification for bipolar transistors;

and forming the respective layers in a thickness ratio CVDSIN/EPIOX in the range of approximately 5/3 or smaller.

11. The wafer fabrication process of claim 10 comprising forming the CVDSIN layer in the thickness range of 900A-1000A and forming the EPIOX layer in the thickness range of 600A-750A.

12. The wafer fabrication process of claim 10 wherein the thickness ratio CVDSIN/EPIOX is in the preferred range of 3/2 or smaller.

13. The wafer fabrication process of claim 10 wherein the bipolar fabrication steps include an emitter definition mask, etch and N type dopant introduction sequence followed by an emitter anneal step at relatively high temperature, all subsequent to the CMOS active strip mask, etch, $V_T$ adjust, and gate oxide grow sequence, and comprising:

annealing the GOX layer at said relatively high temperature during the emitter anneal step in a relatively rapid thermal cycle.

14. The wafer fabrication process of claim 13 comprising growing the GOX layer over the CMOS transistor active areas using a wet oxide grow process at a temperature no greater than approximately 850° C. followed by anneal ramping of temperature to a relatively high temperature and return to a relatively low temperature in a rapid thermal cycle.

15. A wafer fabrication process comprising BICMOS fabrication steps for fabricating CMOS transistors and bipolar transistors in a substrate of semiconductor material including an NWELL definition mask, etch, and N type dopant material introduction sequence forming an NWELL in the substrate, a PWELL definition mask etch and P type dopant material introduction sequence forming a PWELL in the substrate, growing an epitaxial layer (EPI) of semiconductor material over the substrate, growing an epitaxial oxide layer (EPIOX) over the EPI layer, depositing by chemical vapor deposition a (CVD) nitride layer CVDSIN over the EPIOX layer, a CMOS transistor active area definition mask, etch, field oxide (FOX) grow sequence for framing CMOS transistor active areas of the EPI layer in FOX, CMOS active strip mask, etch, $V_T$ adjust and gate oxide grow sequence, a polygate definition mask and etch sequence, a base definition mask, etch and P type dopant introduction sequence implanting the base of bipolar transistors through the nitride layer CVDSIN and EPIOX layer, and an emitter definition mask, etch and N type dopant introduction sequence followed by an emitter anneal step at relatively high temperature, subsequent to the CMOS active strip mask, etch, $V_T$ adjust, and gate oxide grow sequence, the improved steps for reducing stress defects in the EPI layer comprising:

forming the combined thickness of the nitride layer CVDSIN and epitaxial oxide layer EPIOX to provide a control screen for controlling the base implant to maintain a desired $\beta$ specification for bipolar transistors;

forming the respective layers in a thickness ratio CVDSIN/EPIOX in the range of approximately 5/3 or smaller;

forming a protective nitrox layer over the CVDSIN layer during the FOX grow sequence;

preserving the protective nitrox layer during the CMOS active strip mask, etch, $V_T$ adjust, and gate oxide grow sequence;

and exposing the protective nitrox layer over the nitride layer CVDSIN during the polygate definition mask and etch sequence for protecting the nitride layer CVDSIN during a poly etch.

16. The wafer fabrication process of claim 15 comprising forming the CVDSIN layer in the thickness range of 900A-1000A and forming the EPIOX layer in the thickness range of 600A-750A.

17. The wafer fabrication process of claim 15 wherein the thickness ratio CVDSIN/EPIOX is in the preferred range of 3/2 or smaller.

18. The wafer fabrication process of claim 15 comprising:

forming a photoresist CMOS active strip mask exposing CMOS transistor active areas, etching and removing the CVD nitride layer over the CMOS transistor active areas, and leaving the EPIOX layer;

introducing P type dopant material through the EPIOX layer into the CMOS transistor active areas with the photoresist active strip mask in place for adjusting the threshold voltage ($V_T$) of the CMOS transistors;

stripping the EPIOX layer over the CMOS transistor active areas without growing a sacrificial oxide SACOX layer and then removing the photoresist CMOS active strip mask;

and growing a gate oxide (GOX) layer over the CMOS transistor active areas using a wet oxide grow process at relatively lower temperature than a dry oxide grow process.

19. The wafer fabrication process of claim 18 comprising growing the GOX layer over the CMOS transistor active areas using a wet oxide grow process at a temperature no greater than approximately 850° C. followed by anneal ramping of temperature to a relatively high temperature and return to a relatively low temperature in a rapid thermal cycle.

20. The wafer fabrication process of claim 19 wherein the step of ramping of temperature comprises ramping the temperature to no greater than approximately 950° C. and returning to a relatively low temperature.

21. The wafer fabrication process of claim 18 comprising the step of annealing the GOX layer at said relatively high emitter anneal temperature during the emitter anneal step in a relatively rapid thermal cycle.

* * * * *